(12) United States Patent
Chen et al.

(10) Patent No.: US 10,193,006 B2
(45) Date of Patent: Jan. 29, 2019

(54) NANOWIRE COMPOSITE STRUCTURE AND METHODS OF FORMING THE SAME, SENSING DEVICE AND METHODS OF FORMING THE SAME AND PROTECTIVE STRUCTURES OF A NANOWIRE

(71) Applicant: NATIONAL TSING HUA UNIVERSITY, Hsinchu (TW)

(72) Inventors: Hsueh-Shih Chen, Hsinchu (TW); Pin-Ru Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/625,558

(22) Filed: Jun. 16, 2017

(65) Prior Publication Data

US 2017/0365729 A1 Dec. 21, 2017

(30) Foreign Application Priority Data

Jun. 20, 2016 (TW) .............................. 105119267 A (51) Int. Cl.

| | |
|---|---|
| H01L 31/0352 | (2006.01) |
| H01L 31/18 | (2006.01) |
| H01L 31/0203 | (2014.01) |
| G06F 3/041 | (2006.01) |
| H01L 31/0216 | (2014.01) |

(Continued)

(52) U.S. Cl.
CPC ........ *H01L 31/035227* (2013.01); *G01J 1/00* (2013.01); *G01L 1/18* (2013.01); *G01L 1/2287* (2013.01); *G06F 3/041* (2013.01); *H01L 31/0203* (2013.01); *H01L 31/0216* (2013.01); *H01L 31/0272* (2013.01);

(Continued)

(58) Field of Classification Search
CPC ....... H01L 31/035227; H01L 31/03529; H01L 31/03926; H01L 31/0216; H01L 31/0272; H01L 31/0203; H01L 31/1864; G01L 1/24; G01L 1/04; G06F 3/041; G06F 2203/04103
See application file for complete search history.

(56) References Cited

U.S. PATENT DOCUMENTS 7,906,778 B2 * 3/2011 Kobayashi ............. B82Y 10/00
257/51
8,003,071 B2 8/2011 Prokisch et al.
(Continued)

FOREIGN PATENT DOCUMENTS

| CN | 101101968 A | 1/2008 |
|---|---|---|
| TW | 201248655 | 12/2012 |

OTHER PUBLICATIONS

Chen et al., "One-Pot Synthesis of Cubic ZnSe Entangled Nanowires and Hexagonal Se Nanorods," The Royal Society of Chemistry 2014, Oct. 2014, pp. 52898-52902, vol. 4, Royal Society of Chemistry, UK.

*Primary Examiner* — Victor A Mandala (57) ABSTRACT

A nanowire composite structure is provided. The nanowire composite structure includes a nanowire core, wherein a material of the nanowire core includes Se, Te or a combination thereof. The nanowire composite structure also includes a metal layer covering the nanowire core. A method for forming the nanowire composite structure, a protective structure of a nanowire, a sensing device, and a method for forming a sensing device are also provided.

10 Claims, 4 Drawing Sheets

(51) Int. Cl.
*H01L 31/0272* (2006.01)
*H01L 31/0392* (2006.01)
*G01J 1/00* (2006.01)
*G01L 1/18* (2006.01)
*G01L 1/22* (2006.01)

(52) U.S. Cl.
CPC .. *H01L 31/03529* (2013.01); *H01L 31/03926* (2013.01); *H01L 31/1864* (2013.01); *G06F 2203/04103* (2013.01)

(56) References Cited

U.S. PATENT DOCUMENTS

| | | | |
|---|---|---|---|
| 8,221,711 B1 | 7/2012 | Lee | |
| 8,399,939 B2 | 3/2013 | Walker et al. | |
| 9,634,163 B2* | 4/2017 | Fonash | B82Y 20/00 |
| 2008/0176030 A1* | 7/2008 | Fonash | B82Y 20/00 |
| | | | 428/119 |
| 2009/0261438 A1* | 10/2009 | Choi | B82Y 20/00 |
| | | | 257/431 |
| 2011/0001125 A1* | 1/2011 | Ahn | H01L 31/0232 |
| | | | 257/14 |
| 2011/0079706 A1* | 4/2011 | Michalewicz | H01L 27/1446 |
| | | | 250/208.1 |
| 2011/0136288 A1* | 6/2011 | Duane | H01L 21/02381 |
| | | | 438/59 |

\* cited by examiner

FIG. 5C ic structure, and good characteristics compared to common crystals. Therefore, nanowires can be applied to electronic devices, photo electronic devices, or detectors for sensing poisonous gas. In addition, since the structure of a nanowire is restricted to one-dimension, nanowires can also be used in semiconductors with this structural limit. The example for this application can be micro semiconductor devices, such as single electron transistors, or field effect transistors. A photon sensor can also demonstrate good performance by introducing a nanowire therein.

NANOWIRE COMPOSITE STRUCTURE AND METHODS OF FORMING THE SAME, SENSING DEVICE AND METHODS OF FORMING THE SAME AND PROTECTIVE STRUCTURES OF A NANOWIRE

CROSS REFERENCE TO RELATED APPLICATIONS

This application claims priority of Taiwan Patent Application No. 105119267, filed on Jun. 20, 2016 and entitled "NANOWIRE COMPOSITE STRUCTURE AND METHODS OF FORMING THE SAME, SENSING DEVICE AND METHODS OF FORMING THE SAME AND PROTECTIVE STRUCTURES OF A NANOWIRE", the entirety of which is incorporated by reference herein.

BACKGROUND OF THE INVENTION

Field of the Invention

The present invention relates to nanowire techniques, and in particular to nanowire composite structures and methods of forming the same, and sensing devices and methods of forming the same from these nanowires.

Description of the Related Art

Recently, since carbonaceous nanotubes appeared, a variety of one-dimensional nanostructured materials have been developed. In fact, nanowire is a one-dimensional nanostructured material in the shape of a line. Unlike other common crystals, nanowire does not have impurities, lattice defects, or dislocation. Hence, nanowire has a good crystal structure, and good characteristics compared to common crystals. Therefore, nanowires can be applied to electronic devices, photo electronic devices, or detectors for sensing poisonous gas. In addition, since the structure of a nanowire is restricted to one-dimension, nanowires can also be used in semiconductors with this structural limit. The example for this application can be micro semiconductor devices, such as single electron transistors, or field effect transistors. A photon sensor can also demonstrate good performance by introducing a nanowire therein.

The on/off ratio of the photo sensor impacts the sensitivity of the photo sensor. A higher on/off ratio means higher sensitivity. The photo sensor having a higher on/off ratio can detect weak signals. However, the on/off ratio of conventional photo sensors are almost all lower than 10. Moreover, the number of required steps and the production time are quite high for manufacturing a conventional photo sensor, and this incurs additional costs. Therefore, a photo sensor having a simple manufacturing process and a high on/off ratio and a method for forming the same are needed for applying in electric or photo electric elements and sensors.

BRIEF SUMMARY OF THE INVENTION

The disclosure provides nanowires and nanowire composite structures. The nanowires and the nanowire composite structures can be used as a sensing device which has an excellent on/off ratio.

The disclosure provides a nanowire composite structure. The nanowire composite structure includes a nanowire core, wherein the material of the nanowire core includes Se, Te, or a combination thereof. The nanowire composite structure also includes a metal layer covering the nanowire core.

The disclosure provides a method for forming a nanowire composite structure. The method includes the step of (A) mixing a first precursor solution and a second precursor solution; (B) heating a mixed solution of the first precursor solution and the second precursor solution to form a nanowire core; (C) adding a metal salt to mix with the nanowire core and forming a metal layer covering a surface of the nanowire core; wherein, the first precursor solution includes a surfactant and a first solvent, and the second precursor solution includes a group 16 element and a second solvent.

The disclosure provides a protective structure of a nanowire. The protective structure of a nanowire includes a metal layer covering a surface of the nanowire core, wherein a material of the metal layer includes Ag or Cu. The protective structure of a nanowire also includes a metal oxide layer covering the metal layer and being the outermost layer of the protective structure, wherein a material of the metal oxide layer includes $TiO_2$ or $SiO_2$.

The disclosure provides a sensing device. The sensing device includes a substrate. The sensing device also includes a first electrode and a second electrode disposed on the substrate. The sensing device further includes a plurality of nanowires disposed on the substrate and between the first electrode and the second electrode, wherein the nanowires include a first nanowire in contact with the first electrode and a second nanowire in contact with the second electrode, and every nanowire of the plurality of nanowires is in contact with at least another nanowire. The nanowire is a photo sensor.

The disclosure provides a method for forming a sensing device. The method includes providing a substrate and forming a recess in the substrate. The method also includes spraying a solution containing a plurality of nanowires to the recess of the substrate so that the nanowires are attached to the substrate and the recess. The method further includes attaching a first electrode and a second electrode to the substrate. The first and the second electrode are located in two sides of the recess, wherein the nanowires include a first nanowire in contact with the first electrode and a second nanowire contacting the second electrode. Every nanowire of the nanowires is in contact with at least another nanowire.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or structures in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1A:
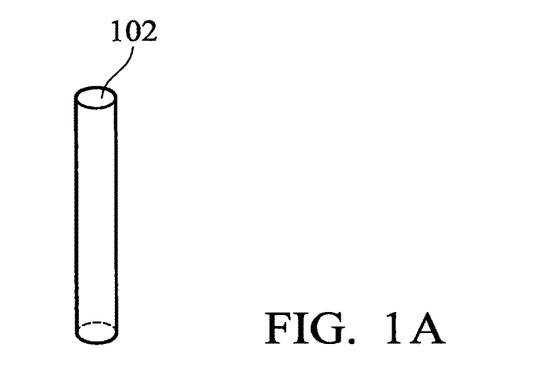
FIGS. 1A to 1C are perspective views of a nanowire and a nanowire composite structure in accordance with some embodiments.

At first, referring to FIG. 1A, FIG. 1A is a perspective view of a nanowire 102 in accordance with some embodiments. As shown in FIG. 1A, the nanowire 102 is a slender wire. The material of the nanowire includes group 16 elements. In some embodiments, the material of the nanowire 102 includes Se, Te or a combination thereof.

Figure 1B:
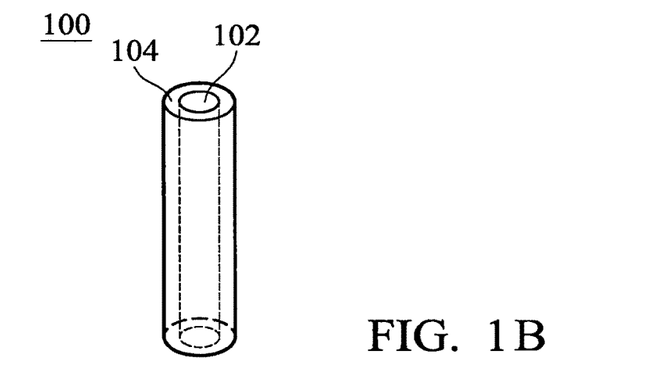

Next, referring to FIG. 1B, FIG. 1B is a perspective view of a nanowire composite structure 100 in accordance with some embodiments. As shown in FIG. 1B, the nanowire composite structure 100 includes the nanowire 102 and a metal layer 104. The nanowire 102 is a core of the nanowire composite structure 100, and the metal layer 104 covers a surface of the nanowire 102. In some embodiments, the material of the metal layer 104 includes Ag, Cu, other applicable metals or a combination thereof.

Figure 1C:
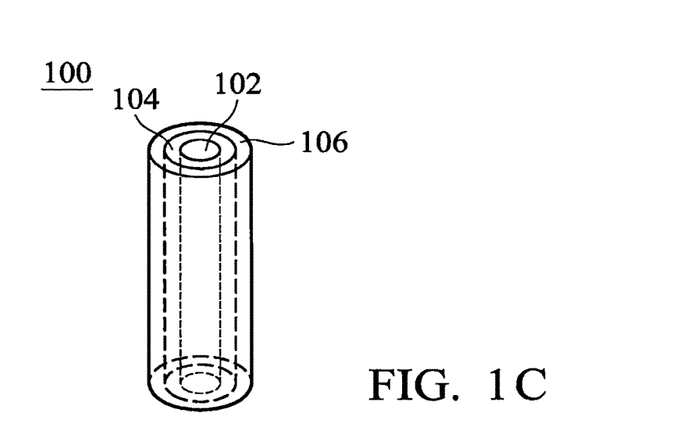

Next, referring to FIG. 1C, FIG. 1C is a perspective view of the nanowire composite structure 100 in accordance with some embodiments. As shown in FIG. 1C, the nanowire composite structure 100 further includes a metal oxide layer 106. The metal oxide layer 106 covers the metal layer 104 and is the outermost layer of the nanowire composite structure 100. In some embodiments, the metal oxide layer 106 includes Titanium dioxide ($TiO_2$) or Silicon dioxide ($SiO_2$).

Figure 2:
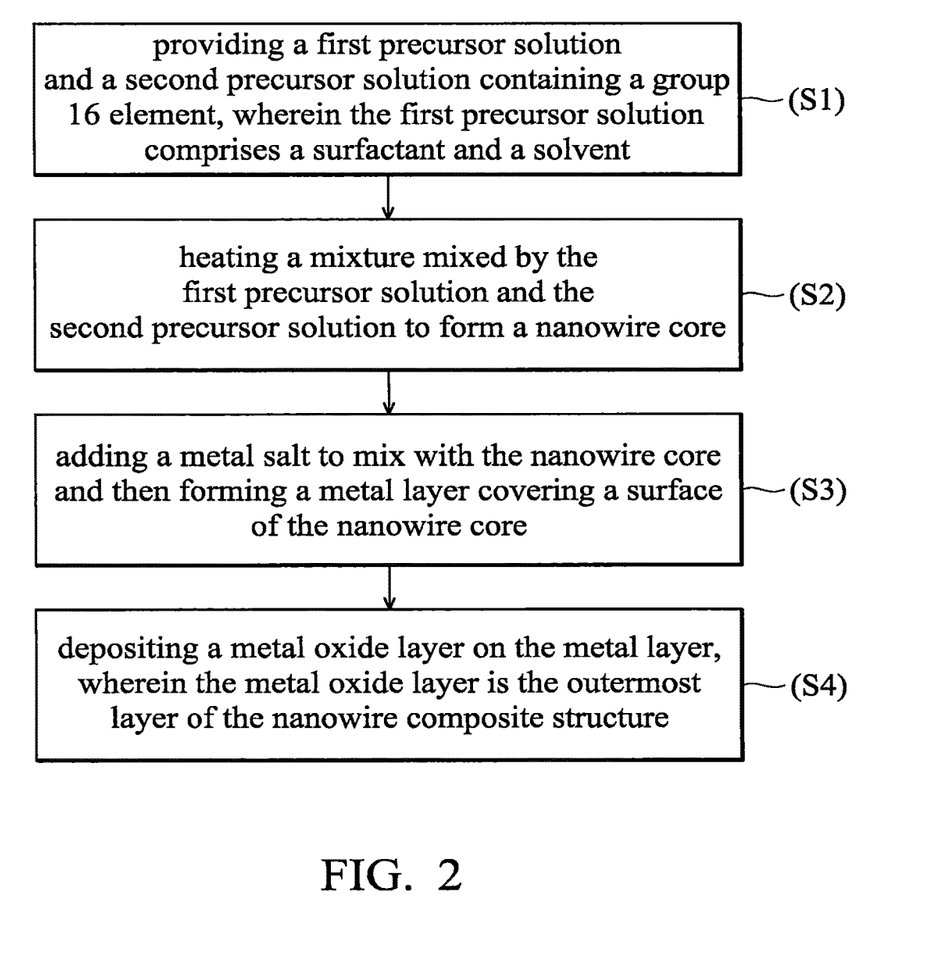
FIG. 2 is a process flow for forming a nanowire composite structure in accordance with some embodiments.

Referring to FIG. 2, FIG. 2 is a process flow for forming the nanowire composite structure 100 in accordance with some embodiments. As shown in FIG. 2, The method of forming the nanowire composite structure 100 includes the step of (S1), for example, 20 mmol of trioctylphosphine oxide (TOPO) and 40 mmol of isophthalic acid (IPA) are added to a three-necked flask, heated to 150° C. under Ar atmosphere and maintained for 20 to 60 minutes to form a first solvent; (S2) for example, 3 mmole of selenium (Se) powder is dried in the vacuum to remove moisture. Then, the dried selenium powder is dissolved in 6 mmol of tributylphosphine (TBP) under inert atmosphere and dispersed by supersonic vibration for 30 minutes to form a second solvent. The second solvent is injected into the three-necked flask and mixed with the first solvent, then heated to 200 to 400° C. and maintained for 5 to 60 minutes to form Se nanowires; (S3) for example, Silver nitrate ($AgNO_3$) is dissolved in the water and introduced into the three-necked flask to mix with the Se nanowires at 25 to 400° C. and maintained for 5 to 60 minutes. Then, a Se/Ag nanowire composite structure having a surface covered by a silver layer; (S4) after forming the Se/Ag nanowire composite structure, the methanol is added to the three-necked flask and dispersed by supersonic vibration for 30 minutes. Then the mixture is centrifugalized to remove side products, and the Se/Ag nanowire composite structure is dried in the vacuum under room temperature. Finally, $TiO_2$ is deposited on a surface of the Se/Ag nanowire composite structure by atomic layer deposition (ALD) process to form Se/Ag/$TiO_2$ nanowire composite structure. In this embodiment, $TiO_2$ is the outermost layer as a protective layer to cover the Se/Ag nanowire composite structure.

In the step of (S1), isophthalic acid is used as a surfactant, and may be replaced by organic acid or its salt which contain benzene group. For example, an organic acid having great steric hindrance is better. In some embodiments, the surfactant comprises benzoic acid, terephthalic acid, p-phenylenediacetic acid, p-phenylenedipropionic acid, isophthalic acid, m-phenylenediacetic acid, m-phenylenedipropionic acid, phthalic acid, o-phenylenediacetic acid or o-phenylenedipropionic acid In the step of (S1), trioctylphosphine oxide is used as a solvent of the surfactant, and may be replaced by another solvent which does not decompose under high temperatures.

In the step of (S2), the heating temperature is generally between 200 and 400° C., and 300 to 360° C. is preferable.

In the step of (S3), $AgNO_3$ may be replaced with other metal salts. For example, metal salts having good electrical conductivity are better.

In the step of (S4), $TiO_2$ may be replaced with other metal oxides. For example, metal oxides having good thermal stability are better.

In the process flow of forming the nanowire composite structure shown in FIG. 2, the reaction may be terminated in any of steps (S2), (S3) or (S4). The methods of separating products from side products are well known to those skilled in the art, and are not limited thereto. If the reaction is terminated in the step of (S2), the Se nanowires are obtained. If the reaction is terminated in the step of (S3), the Se/Ag nanowire composite structures are obtained. If the reaction is terminated in the step of (S4), the Se/Ag/$TiO_2$ nanowire composite structures are obtained.

Figure 3:
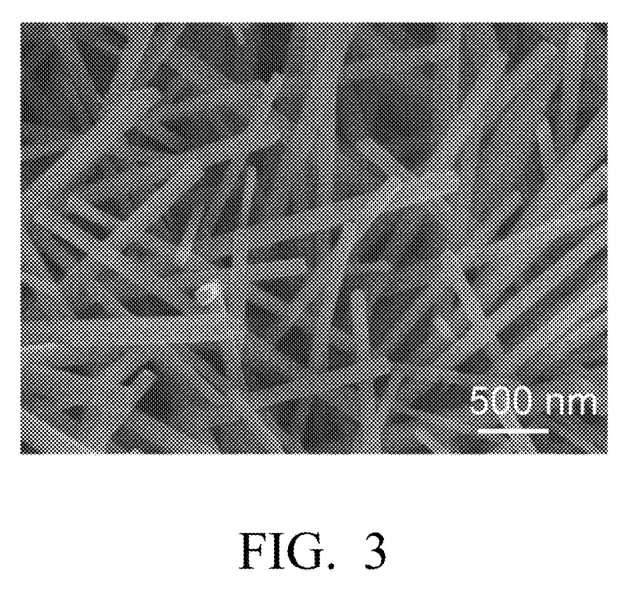
FIG. 3 is a scanning electron microscope (SEM) image of Se nanowires in accordance with some embodiments.

FIG. 3 is a scanning electron microscope (SEM) image of the Se nanowires in accordance with some embodiments. As shown in FIG. 3, the width of the Se nanowires synthesized by the present embodiments is between about 85 and 260 nm, and the length is between about 3 and 40 μm. The cross-sectional shape of the Se nanowires may be hexagonal, square or round.

$AgNO_3$ may be added to mix with the Se nanowire to form the Se/Ag nanowire composite structure so that the surface of the Se nanowire is covered by one silver layer. In some embodiments, the thickness of the silver layer is between about 10 and 200 nm. The thickness of the silver layer and the ratio of Ag in the Se/Ag nanowire composite structure vary with the concentration of $AgNO_3$ added in the step of (S3). In some embodiments, the ratio of Ag is between about 5 and 25%, and the ratio of Se is between about 75 and 95%.

The Se/Ag/$TiO_2$ nanowire composite structure may be formed by depositing $TiO_2$ over the Se/Ag nanowire composite structure. $TiO_2$ covers a surface of the Se/Ag nanowire composite structure and becomes a protective shell of the nanowire composite structure.

In addition, in some embodiments, the nanowire or the nanowire composite structure may be crystal.

In other some embodiments, selenium powder may be replaced by tellurium (Te) powder to form a Te nanowire, a Te/Ag nanowire composite structure, and a Te/Ag/$TiO_2$ nanowire composite structure. The steps and the processing conditions may be the same as those mentioned above.

Figure 4:
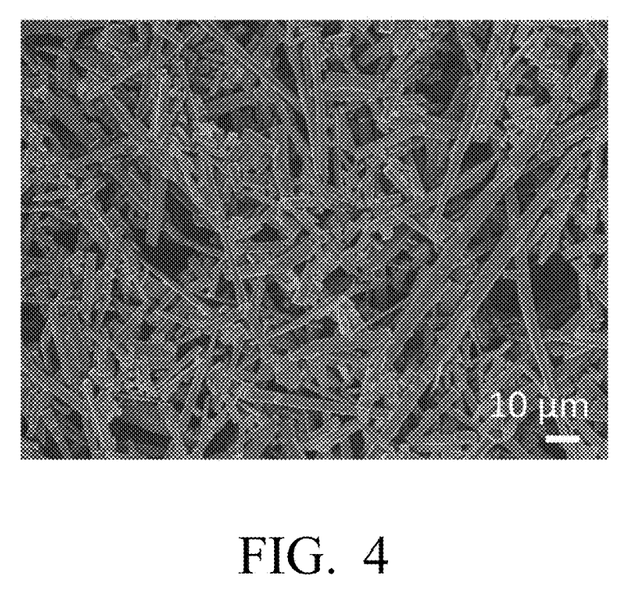
FIG. 4 is a SEM image of Te nanowires in accordance with some embodiments.

FIG. 4 is a scanning electron microscope image of the Te nanowires in accordance with some embodiments. As shown in FIG. 4, the width of the Te nanowire synthesized by the present embodiments is between about 0.5 and 5 μm, and the length is between about 2 and 100 μm. The cross-sectional shape of the Te nanowire may be hexagonal, square or round.

$AgNO_3$ may be added to mix with the Te nanowire to form a Te/Ag nanowire composite structure so that a surface of the Te nanowire is covered by one silver layer. In some embodiments, the thickness of the silver layer is between about 10 and 200 nm. The thickness of the silver layer and the ratio of Ag in the Te/Ag nanowire composite structure vary with the concentration of $AgNO_3$ added in the step of (S3). In some embodiments, the concentration of $AgNO_3$ is 0.01M, the atomic ratio of Ag is 21.5%, and the atomic ratio of Te is 78.5% in the Te/Ag nanowire composite structure. In some embodiments, the concentration of $AgNO_3$ is 0.005M, the atomic ratio of Ag is 22.1%, and the atomic ratio of Te is 77.9% in the Te/Ag nanowire composite structure. In some embodiments, the concentration of $AgNO_3$ is 0.001M, the atomic ratio of Ag is 6.5%, and the atomic ratio of Te is 93.5% in the Te/Ag nanowire composite structure.

A Te/Ag/$TiO_2$ nanowire composite structure may be formed by depositing $TiO_2$ over the Te/Ag nanowire composite structure. $TiO_2$ covers a surface of the Te/Ag nanowire composite structure and becomes a protective shell of the nanowire composite structure.

According to some embodiments of the present invention, a silver layer and a titanium dioxide ($TiO_2$) layer are used as a protective structure to cover the surface of the nanowire core. Compared with simply having a nanowire core, it provides better electrical conductivity and thermal stability. Although the embodiments only recite that the protective structure may be used to protect the Se nanowire or the Te nanowire, the objects protected by the protective structure are not limited thereto. In addition, silver layer may be replaced by other metals, such as Cu. Titanium dioxide layer may be replaced by other metal oxides having good thermal stability, such as $SiO_2$.

The nanowire or the nanowire composite structure provided by the embodiments of the present invention may be used as a photo sensor and disposed in the sensing device. The nanowire absorbs lights so that an electron of the nanowire excites to conduction band, and a hole is formed in the valence band. In this time, the electron and the hole are transferred in the nanowire to form a current, and the energy or the power of the light may be detected by measuring the electron signal.

Figure 5A:
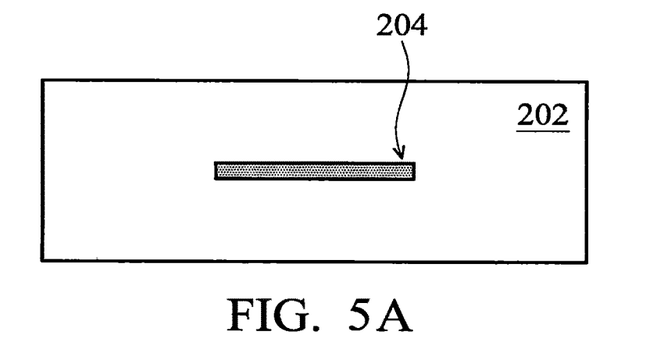
FIGS. 5A-5C are cross-sectional views of various stages of forming a sensing device in accordance with some embodiments.
Figure 5B:
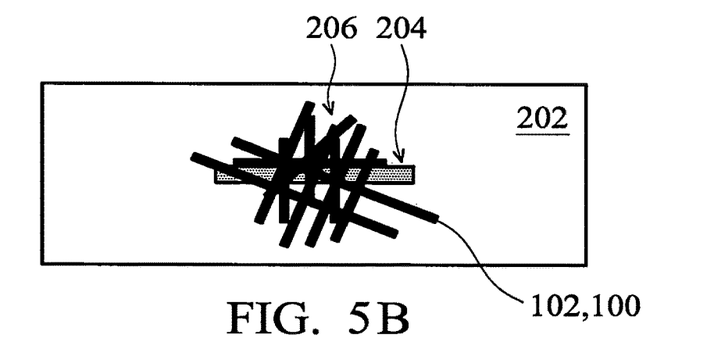
Figure 5C:
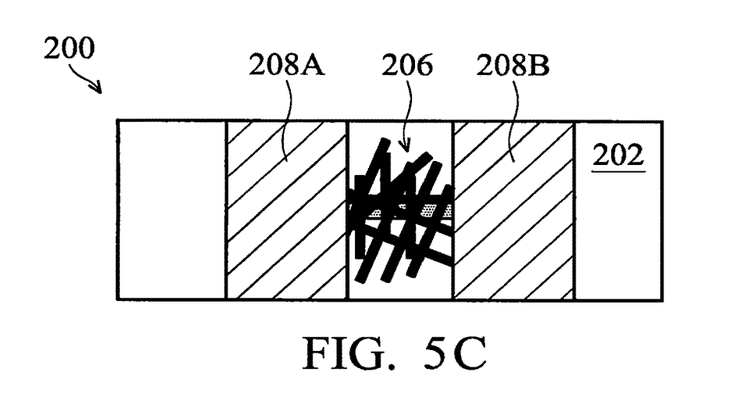

FIGS. 5A-5C are cross-sectional views of various stages of forming a sensing device 200 by using the nanowire and the nanowire composite structure as a photo sensor 206, in accordance with some embodiments. As shown in FIG. 5A, a substrate 202 is provided. The substrate 202 may be a glass substrate or a flexible substrate, such as a polyethylene terephthalate (PET) substrate. A recess 204 is formed on a surface of the substrate 202. The method of forming the recess 204 may be using a diamond cutter to cut on the substrate 202.

Referring to FIG. 5B, a plurality of nanowires or nanowire composite structures are dispersed to a volatile solvent (such as ethanol, methanol and benzene), and coated on the recess 204 of the substrate 202. After the solvent is evaporated, the photo sensor 206 composed of the plurality of nanowires or nanowire composite structures is formed. In some embodiments, the plurality of nanowires is used as the photo sensor 206. As shown in FIG. 5B, the nanowires are disposed on the substrate 202 and the recess 204, wherein every nanowire is in contact with at least another nanowire and these nanowires are arranged at random. In some embodiments, the photo sensor 206 may be a plurality of Se nanowires, Te nanowires, Se/Ag nanowire composite structures, Te/Ag nanowire composite structures, Se/Ag/TiO$_2$ nanowire composite structures, Te/Ag/TiO$_2$ nanowire composite structures or a combination thereof.

Referring to FIG. 5C, a first electrode 208A and a second electrode 208B are disposed on the surface of the substrate 202. The material of the first electrode 208A and the second electrode 208B may be metal, such as a copper sheet. As shown in FIG. 5C, the first electrode 208A and the second electrode 208B are attached to two sides of the recess 204 of the substrate 202. The first electrode 208A and the second electrode 208B contact at least one nanowire or nanowire composite structure. After the first electrode 208A and the second electrode 208B are disposed on the substrate 202, a sensing device 200 is completed. The electron signal of the sensing device 200 is delivered from the first electrode 208A to the second electrode 208B through the nanowires or the nanowire composite structures of the photo sensor 206. In some embodiments, the photo sensor 206 detects light in a range between about 400 and 700 nm.

In some embodiments, when the Se nanowire is used as the material of the photo sensor 206, the on/off ratio of the sensing device is 22.7, which is much higher than the on/off ratio of the conventional sensing device (generally between 1 and 10). This means that the sensing device 200 provided by the embodiments of the present invention has higher sensitivity and smaller detection limit.

By using the nanowire or the nanowire composite structure of the present invention as the photo sensor 206, the time to form the nanowire and the nanowire composite structure is not long, and the yield can reach more than 70%. Therefore, the cost of forming the sensing device is reduced. Moreover, the process of forming the sensing device 200 is simple. Only the substrate 202, the first electrode 208A, the second electrode 208B, the nanowire or the nanowire composite structure are needed to compose the photo sensor 206, and then the sensing device 200 may be formed. Additional steps are not needed to obtain the sensing device 200 which has a high on/off ratio using the methods of the present embodiments. For example, in the step of dispersing the nanowire or the nanowire composite structure on the recess 204 of the substrate 202, there is no need to perform a voltage or create an electric field so that the arrangement of the nanowire or the nanowire composite structure becomes uniform. According to the sensing device 200 provided by the present invention, even if the arrangement of the plurality of nanowires or the nanowire composite structures is random, the performance of the sensing device 200 is not impacted. Furthermore, compared to the Se nanowire, a higher on/off ratio is obtained by using the Se/Ag nanowire composite structure as the photo sensor 206. The sensitivity of the sensing device 200 can be improved by coating the silver layer on the surface of the Se nanowire.

In addition, the photo sensor 206 can be applied not only in a photo sensor, but also in a bend sensor. In some embodiments, a flexible PET substrate may be used as the substrate 202, and the Te/Ag nanowire composite structure is used as the photo sensor 206. In this embodiment, the electric signal detected by the sensing device 200 varies with different curvatures of the substrate 202. When the substrate 202 is curved, the distance between Te/Ag nanowire composite structures is changed, and then the resistance of the sensing device 200 is also changed. Therefore, the different electric signals between the first electrode 208A and the second electrode 208B are detected. When the curvature of the substrate 202 becomes greater, the electric signal also becomes greater. In some embodiments, the sensing device 200 provided by present invention can be used as the bend sensor. Moreover, the substrate 202 may be bended repeatedly, and the electric signal does not vary with the amount of use.

Furthermore, the photo sensor 206 provided by the present invention also may be applied in somatosensory sensing (for example, body benders such that the resistance of the sensor is changed) and in pressure sensing. The reason is the same as that mentioned above. When the distance between nanowires or nanowire composite structures vary with the pressure or the bending substrate, the resistance between the first electrode 208A and the second electrode 208B is changed. Then the electrical signal is changed, and then the somatosensory or the pressure sensing is performed.

As mentioned above, the nanowire, the nanowire composite structure, and the sensing device formed by it provided by the present invention have the advantages of a simple manufacturing process, a short production time, and a high yield. The sensor has a high on/off ratio and may be applied in bend sensing, somatosensory sensing and pressure sensing by bending the substrate of the sensor. Moreover, the sensing device can be used repeatedly.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A sensing device, comprising:
   a substrate;
   a first electrode and a second electrode disposed on the substrate; and
   a plurality of nanowires disposed on the substrate and between the first electrode and the second electrode, wherein the plurality of nanowires comprises a first nanowire in contact with the first electrode and a second nanowire in contact with the second electrode, and every nanowire of the plurality of nanowires is in contact with at least another nanowire, and wherein the plurality of nanowires is a photo sensor, and the sensing device is used for a bend sensing, a somatosensory sensing or a pressure sensing.

2. The sensing device as claimed in claim 1, wherein a material of the nanowires comprises Se, Te or a combination thereof.

3. The sensing device as claimed in claim 1, wherein the substrate comprises a glass substrate or a flexible substrate.

4. The sensing device as claimed in claim 1, wherein an arrangement of the plurality of nanowires is random.

5. The sensing device as claimed in claim 1, wherein the substrate is a flexible substrate, and a distance between the nanowires varies with a curvature of the flexible substrate, a current generated between the first electrode and the second electrode varies with the curvature of the flexible substrate, and the sensing device is used for detecting the curvature of the substrate.

6. A sensing device, comprising:
a substrate;
a first electrode and a second electrode disposed on the substrate; and
a plurality of nanowires disposed on the substrate and between the first electrode and the second electrode, wherein the plurality of nanowires comprises a first nanowire in contact with the first electrode and a second nanowire in contact with the second electrode, and every nanowire of the plurality of nanowires is in contact with at least another nanowire, and wherein the plurality of nanowires is a photo sensor, and the nanowires are Se or Te.

7. The sensing device as claimed in claim 6, wherein the substrate comprises a glass substrate or a flexible substrate.

8. The sensing device as claimed in claim 6, wherein an arrangement of the plurality of nanowires is random.

9. The sensing device as claimed in claim 6, wherein the substrate Is a flexible substrate, and a distance between the nanowires varies with a curvature of the flexible substrate, a current generated between the first electrode and the second electrode varies with the curvature of the flexible substrate, and the sensing device is used for detecting the curvature of the substrate.

10. The sensing device as claimed in claim 6, wherein the sensing device is used for a bend sensing, a somatosensory sensing or a pressure sensing.

\* \* \* \* \*